United States Patent
Bosselmann et al.

(10) Patent No.: US 6,515,467 B1
(45) Date of Patent: Feb. 4, 2003

(54) METHOD AND SYSTEM FOR OPTICALLY DETECTING AN ELECTRIC CURRENT BY MEANS OF LIGHT SIGNALS HAVING DIFFERENT WAVELENGTHS

(75) Inventors: Thomas Bosselmann, Marloffstein (DE); Stephan Mohr, Jena (DE); Michael Willsch, Fürth (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/868,855

(22) PCT Filed: Dec. 13, 1999

(86) PCT No.: PCT/DE99/03976

§ 371 (c)(1),
(2), (4) Date: Jun. 21, 2001

(87) PCT Pub. No.: WO00/37949

PCT Pub. Date: Jun. 29, 2000

(30) Foreign Application Priority Data

Dec. 22, 1998 (DE) .......................... 198 59 448

(51) Int. Cl.$^7$ .................. G01R 31/00; G01R 33/00; G01J 4/00
(52) U.S. Cl. .................. 324/96; 324/117 R; 324/244.1; 250/227.17; 250/225; 250/227.19; 356/368
(58) Field of Search .................. 324/96, 117 R, 324/244.1; 250/227.17, 225, 227.19; 356/368

(56) References Cited

U.S. PATENT DOCUMENTS

| | | | | |
|---|---|---|---|---|
| 3,597,683 A | * | 8/1971 | Saito ........................... 324/96 |
| 3,707,329 A | * | 12/1972 | Jaecklin et al. ............. 356/117 |
| 3,708,747 A | * | 1/1973 | Lesuer ........................ 324/96 |
| 3,753,101 A | * | 8/1973 | Aumont ....................... 324/96 |
| 4,629,323 A | * | 12/1986 | Matsumoto .................. 356/365 |
| 4,683,421 A | * | 7/1987 | Miller et al. ................... 324/96 |
| 4,698,497 A | | 10/1987 | Miller et al. ............. 250/231.1 |
| 4,916,387 A | | 4/1990 | Miller ......................... 324/96 |
| 4,947,107 A | * | 8/1990 | Doerfler et al. ................ 324/96 |
| 5,051,577 A | * | 9/1991 | Lutz et al. .............. 250/227.17 |
| 5,834,933 A | * | 11/1998 | Meier ...................... 324/117 R |
| 5,844,409 A | * | 12/1998 | Bosselmann et al. ......... 324/96 |
| 5,933,000 A | * | 8/1999 | Bosselmann et al. ......... 324/96 |
| 5,963,026 A | * | 10/1999 | Bosselmann et al. ......... 324/96 |
| 6,034,523 A | * | 3/2000 | Bosselmann et al. ... 324/117 R |
| 6,043,648 A | * | 3/2000 | Menke et al. ............. 324/244.1 |
| 6,111,416 A | * | 8/2000 | Zhang et al. .................. 324/96 |
| 6,154,022 A | * | 11/2000 | Willsch et al. ................ 324/96 |
| 6,281,672 B1 | * | 8/2001 | Terai et al. .................... 324/96 |

FOREIGN PATENT DOCUMENTS

| | | |
|---|---|---|
| DE | 31 41 325 A1 | 4/1983 |
| DE | 195 44 778 A1 | 6/1997 |
| DE | 196 21 654 A1 | 12/1997 |
| EP | 0 210 716 A1 | 2/1987 |
| EP | 0 657 740 A2 | 6/1995 |
| JP | 5-264608 | 10/1993 |
| WO | 98/05975 | 2/1998 |
| WO | 98/12565 | 3/1998 |
| WO | 98/38517 | 9/1998 |

* cited by examiner

Primary Examiner—Diego Gutierrez
Assistant Examiner—Wasseem H. Hamdan
(74) Attorney, Agent, or Firm—Morrison & Foerster, LLP

(57) ABSTRACT

The method and system serve to optically detecting an electric current with an extended measurement range. To that end, two light signals having different wavelengths pass through a Faraday element, the polarization of the two light signals being rotated in each case by at least 0.0014°/A as a function of the electric current. By taking account of both wavelength-dependent polarization rotations, at least one of which lies beyond an unambiguity range, the measurement range is extended distinctly beyond the unambiguity range of each of the two light signals.

16 Claims, 4 Drawing Sheets

METHOD AND SYSTEM FOR OPTICALLY DETECTING AN ELECTRIC CURRENT BY MEANS OF LIGHT SIGNALS HAVING DIFFERENT WAVELENGTHS

This application claims priority to International Application No. PCT/DE99/03976 which was published in the German language on Jun. 29 2000.

TECHNICAL FIELD OF THE INVENTION

The invention relates to a system and method for optically detecting for optically detecting an electric current, and in particular, to optically detecting an electric current by using light signals having different wavelengths.

BACKGROUND OF THE INVENTION

WO 98/38517 A1 describes an arrangement for measuring current, in which two light signals each having a different wavelength are generated and are fed via a coupler into an optical waveguide. The optical waveguide serves as a common feed to a Faraday element. Before entering the Faraday element, both light signals are linearly polarized. In this connection, linear polarization is to be regarded as a particularly favorable special form of elliptical polarization. Generally, however, any other elliptical polarization form is equally suitable as long as it has a marked direction. The first light signal has a wavelength of between 630 and 850 nm and the second light signal has a wavelength of between 1300 and 1550 nm. On account of the wavelength-dependent Verdet's constant, the polarizations of the two light signals arc influenced to different extents in the Faraday element. The changes in polarization caused by the current are evaluated in a single-channel or two-channel manner. In an evaluation unit; the two light signals are separated from one another in accordance with their wavelength by means of optical filter elements or by means of the sensitivity range of the photodiodes used and are converted into electrical signals for further processing. In this case, the wavelength difference between the two light signals has the effect that the electrical signal derived from the first light signal is an unambiguous function of the current to be measured and the electrical signal derived from the other light signal is a non-unambiguous, periodic function of the current to be measured. By the same token, however, the second derived electrical signal has a higher measurement resolution. From these two electrical signals, a measurement quantity for the electric current is derived with a large measurement range and also with a high measurement resolution. The method used in this case is disclosed in DE 195 44 778 A1.

DE 195 44 778 A1 describes a magneto-optical current converter having two Faraday elements for deriving two different measurement signals. The first Faraday element yields a first measurement signal which, in a predetermined measurement range, is an unambiguous function of the electric current to be measured (=operation in the unambiguity range). By contrast, the second Faraday element is configured in such a way that a second measurement signal that it generates is a non-unambiguous, essentially periodic function of the electric current (=operation in the ambiguity range). A third measurement signal for the electric current is built up from the two measurement signals. The third measurement signal is in the predetermined measurement range. Both signals are an unambiguous function of the measurement quantity and have the same high measurement resolution as the second measurement signal. However, the method described requires a relatively high outlay since two separate Faraday elements. A high computation complexity is also required in the formation of the third measurement signal in an evaluation unit.

Moreover, EP 0 210 716 A1 describes a magneto-optical current sensor which is operated with two light signals having different wavelengths. In this case the two wavelengths do not serve for extending the measurement range, but for drift compensation. The Faraday element is again operated only in the linear, i.e. unambiguous, range of the characteristic curve.

DE 31 41 325 A1 discloses a heterodyne method for optical current measurement, in which two light signals having the same wavelength but different intensity modulation are generated. The frequency difference of the intensity modulation between the two light signals is between 1 kHz and 1 MHz. From these two light signals there is generated a further light signal with a linear polarization vector which rotates with the differential frequency of the two intensity modulations about the direction of propagation of the further light signal. The light signal with rotating linear polarization vector is then both fed into a Faraday element and transmitted as reference signal directly to an evaluation unit. The electric current is then determined by phase comparison between the reference signal and the light signal emerging from the Faraday element. This method also makes it possible to extend the measurement range for the optical current measurement beyond the unambiguity range. However, this method is relatively complex owing to the reference signal and the phase-comparison measuring devices required in the evaluation unit.

WO 98/05975 A1 describes a method and an arrangement for optical current detection, in which two optical measurement signals are generated as a function of the electric current to be measured. The dependence of the two optical measurement signals on the electric current is in each case periodic, the two periods differing from one another at most by the factor 2. From the two optical measurement signals there are derived value pairs to which it is then possible to assign in each case a present value of the electric current to be measured. The procedure described by this method likewise makes it possible to extend the measurement range in the case of optical current detection. However, WO 98/05975 A1 contains no embodiments which are distinguished, for example by particular efficiency.

SUMMARY OF THE INVENTION

In one embodiment of the invention, there is an electric current generates at least one first elliptically polarized light signal having a first polarization and a first wavelength and a second elliptically polarized light signal having a second polarization and a second wavelength, which is different from the first wavelength. The electric current feeds the first and the second light signal into a Faraday element, changes the first and the second polarization as a function of the electric current upon passage through the Faraday element, and derives a measurement signal for the electric current from the changes in polarization of the two light signals. The first and the second polarization are rotated by at least 0.0014° per ampere of the electric current, and at least one of the two polarizations is rotated by more than 45° under the influence of a maximum electric current.

In one aspect of the invention, the first and the second polarization are rotated in the Faraday element by a first and a second angle of rotation. The first and the second angle of rotation differ at most by a factor 2 given at a predetermined electric current.

In another aspect of the invention, there is a wavelength difference between the first and the second wavelength of at most 15% of an average value of the first and second wavelengths. In another aspect of the invention, the first and the second light signals pass through the Faraday element simultaneously.

In yet another aspect of the invention, the first and the second light signals pass through the Faraday element cyclically alternately.

In a further aspect of the invention, the first and the second light signal are generated from an optical swept-frequency signal having a varying wavelength. The varying wavelength is tuned between the first wavelength and the second wavelength.

In a further aspect of the invention, the varying wavelength of the optical swept-frequency signal is tuned periodically between the first wavelength and the second wavelength.

In yet another aspect of the invention, the first and the second light signal are intensity-modulated during generation with a first and a second frequency.

In another embodiment of the invention, a transmitting device generates at least one first elliptically polarized light signal having a first polarization and a first wavelength and a second elliptically polarized light signal having a second polarization and a second wavelength, which is different from the first wavelength. There is a Faraday element, which is assigned to the electrical conductor and through which the first and the second light signal pass, the Faraday element effecting a change in the first and second polarization as a function of the electric current to be detected and of a wavelength-dependent effective Verdet's constant; and an evaluation unit to derive a measurement signal for the electric current from the changes in the first and second polarization. The effective Verdet's constant of the Faraday element has a value of at least 0.0014°/A for both wavelengths, and the Faraday element rotates at least one of the two polarizations by more than 45° given the electric current.

In one aspect of the invention, values of the effective Verdet's constant for the first and the second wavelength differ at most by the factor 2.

In another aspect of the invention, the transmitting device is configured to generate the first and the second light signal with a wavelength difference of at most 15% of an average value of the first and second wavelength.

In another aspect of the invention, the transmitting device is configured to simultaneously feed the first and the second light signal into the Faraday element. The transmitting device is configured to cyclically alternately feed the first and the second light signal into the Faraday element. The transmitting device is further configured to cyclically alternately feed the first and the second light signal and comprise a tunable light source to generate an optical swept-frequency signal having a varying wavelength, the varying wavelength varying between the first and the second wavelength. The tunable light source is configured to generate an optical swept-frequency signal having a periodically varying wavelength. The transmitting device comprises a modulation device to intensity modulate the first light signal with a first frequency and the second light signal with a second frequency.

BRIEF DESCRIPTION OF THE DRAWINGS

Preferred exemplary embodiments will now be explained in more detail with reference to the drawing for illustration, the drawing is not to scale, and certain features are represented diagrammatically. In detail.

Mutually corresponding parts are provided with the same reference symbols in FIGS. 1 to 4.

DETAILED DESCRIPTION OF THE PREFERRED EMBODIMENT

Figure 1:
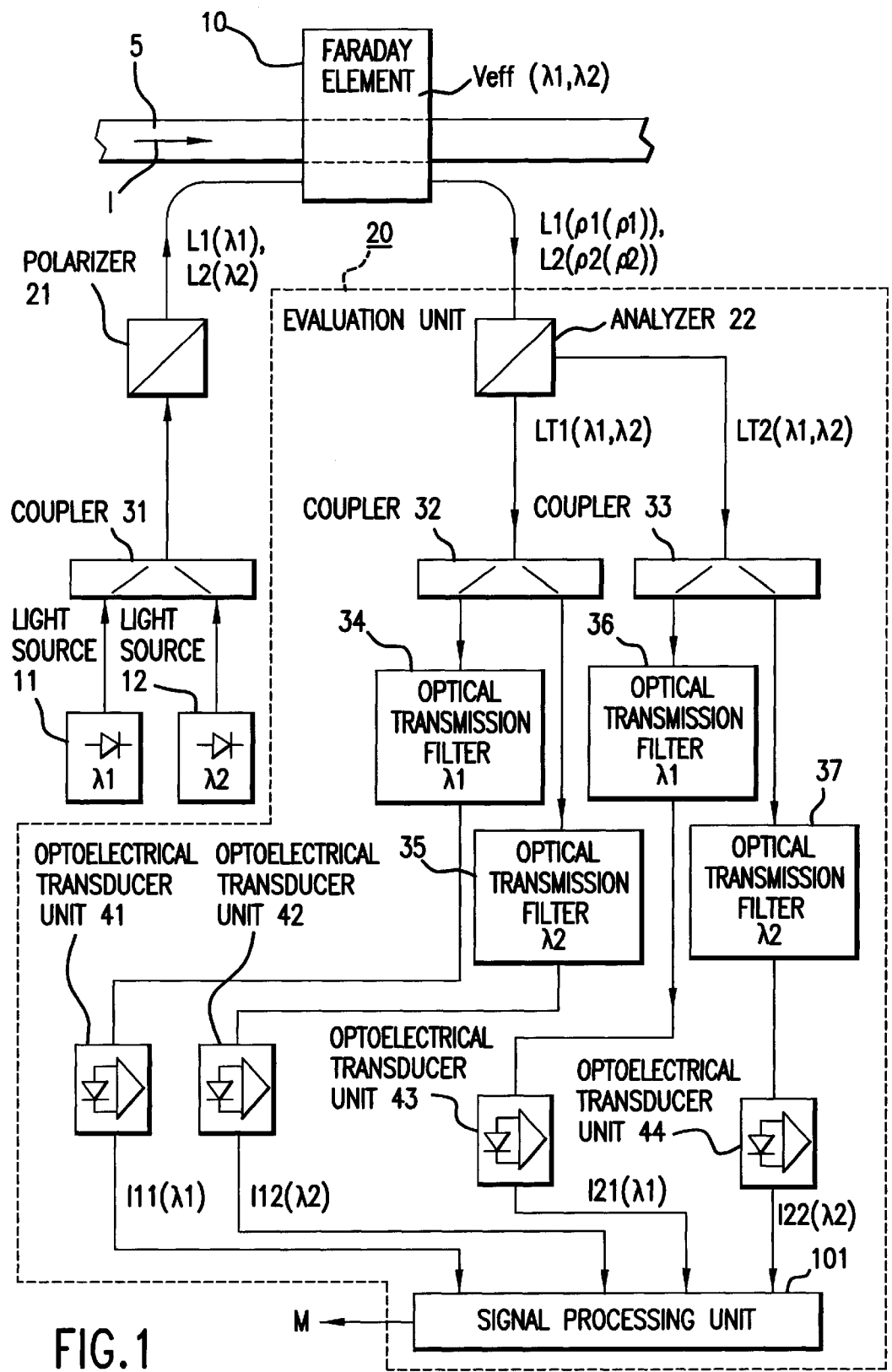
FIG. 1 shows an arrangement for optical current measurement with two light signals having different wavelengths which are fed simultaneously into a Faraday element.

The invention specifies a method and an arrangement for optically detecting an electric current with the highest possible measurement resolution and a measurement range which goes beyond the unambiguity range determined by the Faraday element used and the light wavelength used. Moreover, the intention here is for the optical detection of the electric current to be effected as efficiently as possible.

In the case of the method according to the invention, the first and the second polarization are rotated by at least 0.0014° per ampere of the electric current to be detected. Moreover, at least one of the two polarizations is rotated by more than 45° under the influence of a maximum electric current to be detected.

For each Faraday element, there is a preferred sensitivity range in which, with the aid of two light signals having different wavelengths, the measurement range can be extended in a particularly simple and efficient manner. In this case, the specific embodiment of the Faraday element is not important as long as the Faraday element is transparent to both wavelengths. Specifically, all known embodiments can be designed with a sensitivity range that is particularly favorable with regard to maximum extension of the measurement range.

If the Faraday element is chosen such that the polarization of the two light signals having different wavelengths is rotated by more than 0.0014°/A under the influence of the electric cart to be measured, then an unambiguity range of ≦approximately 20 kA (=root-mean-square value) results for a periodic electric current to be detected. The unambiguity range is determined by the angle-of-rotation range of in which polarization rotations caused by the Faraday element are unambiguous. The maximum value—to be detected unambiguously—of the electric current is then calculated, with the lower limit for the sensitivity of the Faraday element, as:

$$\frac{45°}{0.0014°/A} \le \text{approx. } 32 \text{ kA}( = \text{maximum value})$$

In order then to achieve a resolution of, for example, less than 10 A, the unambiguity range is chosen to be as small as possible. This is achieved by choosing the highest possible sensitivity (distinctly above the lower limit of 0.0014°/A. A very high measurement resolution of e.g. <1 A can then be obtained in the unambiguity range.

Despite the high sensitivity, it is then possible to achieve a maximum detectable electric current of up to a few 10 kA or even up to 100–200 kA, since the two light signals having different wavelengths can be used for extending the measurement range. This is because, given a high electric current, the Faraday element effects a rotation of the associated polarization by more than 45° at least in the case of one of the two light signals. As a result, the change in polarization of at least this light signal exceeds the limit of the unambiguity range, resulting in ambiguities and thus affording the possibility for the desired extension of the measurement range.

From the changes in the first polarization and in the second polarization which are caused by the current to be measured, it is possible to derive a value pair which, in the extended measurement range ($\leq 200$ kA) specified above, can be allocated an unambiguous value of the electric current. In this case, the assignment can be effected either via a previously stored look-up table, in which the value pairs are stored with the associated electric current intensity, or else via a mathematical formula. In addition, a value pair can also be assigned to the causal electric current via a mathematical search algorithm with stored characteristic curve functions or with a stored model of the magneto-optical transducer.

The large measurement range and the high resolution in the case of small currents, i.e. in the unambiguity range, correspond precisely to the requirements in this regard in the area of public electrical power supply, so that the method is particularly suitable for such a use.

In an advantageous embodiment, a first and a second angle of rotation by which the first and, respectively, the second polarization are rotated in the Faraday element differ from one another at most by a factor of 2. This is because, for a measurement range that is as large as possible, it is advantageous if characteristic curves which respectively describe the current dependence for the first and the second wavelength differ as little as possible. In particular, it is advantageous if the periodicities of the characteristic curves, which are sinusoidal to a first approximation disregarding interference-quantity influences, are as close together as possible. The above-mentioned condition results in the periods of the two sinusoidal characteristic curves. differing at most by a factor of 2.

Furthermore, it is preferable if the first and the second wavelength differ from one another by not more than 15% with reference to an average value of both wavelengths. Since the sensitivity of the Faraday element depends on the wavelength, the effect achieved with the range specified for the first and second wavelengths is that the resulting measurement range is at least one order of magnitude larger than the unambiguity range in the case of separate evaluation of the first or of the second light signal.

Another embodiment relates to the feeding of the two light signals into the Faraday element. The two light signals having different wavelengths pass through the Faraday element together, i.e. simultaneously. For evaluation, optical separation into the two light signals in accordance with their respective wavelength is performed, for example. As a result, items of measurement information which are obtained on the basis of the first and second wavelengths are present at every point in time. On account of the (light) signal discrimination exclusively in the wavelength domain, this refinement involves a wavelength division multiplex method (Wavelength Domain Multiplex=WDM).

In another embodiment, the first and the second light signal are fed into the Faraday element periodically alternately. In this embodiment, there is available, at each point in time, the item of measurement information obtained via one of the two wavelengths. However, by means of correspondingly rapid changeover between the two light signals, two successively recorded items of measurement information can be assigned to a single current value to be measured, in particular when a changeover frequency is at least twice as large as a frequency value of a maximum harmonic of a highest frequency component—to be detected—of the electric current I. Optical separation of the two light signals is not necessary in this embodiment. On account of the signal discrimination in the time domain, this embodiment involves a time domain multiplex method (Time Domain Multiplex=TDM).

In addition, an embodiment in which an optical swept-frequency signal having a varying wavelength is sent through the Faraday element is also advantageous. Such a swept-frequency signal can be generated, for example, by means of a wavelength-tunable light source (laser diode, LED, SLD (superluminescent diode) with tunable transmission filter, and tunable fiber laser (TFL)). In this case, the narrowband varying wavelength of the swept-frequency signal assumes wavelength values between the first and second wavelengths. The optical swept-frequency signal can be imagined as including infinitely many individual signals each having mutually different individual wavelengths. With this interpretation, the first and the second light signal having the first and, respectively, the second wavelength are then those individual signals in which the direction of the wavelenth variation is exactly reversed. Feeding theoretically infinitely many individual wavelengths into the Faraday element has the effect that, during evaluation, there is greater leeway for extending the measurement range, since, in principle, an item of measurement information with in each case a mutually different dependence on the electric current to be detected is present for all of the individual wavelengths.

A refinement in which the wavelength of the optical swept-frequency signal is varied periodically alternately is preferred.

In a further advantageous refinement, the intensity of the first light signal is modulated with a first frequency and the intensity of the second light signal is modulated with a second frequency, which differs from the first frequency. This intensity modulation is effected during the generation of the two light signals. To that end, the amplitude of a supply current which excites a light source such as e.g. a laser diode or an LED to effect light emission is varied with the corresponding frequency. The two light signals having mutually different wavelengths and intensity modulation are then fed into the Faraday element. This can be effected either simultaneously or cyclically alternately. For evaluation, the items of measurement information contained in the two light signals are separated from one another by electrical bandpass filtering which is carried out after optoelectrical conversion. In this case, the center frequencies of the bandpass filters correspond to the respective frequency of the intensity modulation. Optical filtering of the two light signals is thereby obviated.

With respect to electrically detecting an electric current in an electrical conductor, the effective Verdet's constant of the Faraday element has a value of at least 0.0014°/A for both wavelengths, and the Faraday element rotates at least one of the two polarizations by more than 45° given a maximum electric current to be detected.

Such an arrangement makes it possible, in a particularly simple and also efficient manner, to extend the measurement range in conjunction with unchanged good measurement resolution.

A transmitting device to generate the two light signals having mutually different wavelengths comprise commercially available light sources such as, for example, two LEDs, two laser diodes or two SLDs. These light sources preferably emit in the infrared wavelength range at approximately 800 nm or at approximately 1300 nm. However, a different wavelength range is equally well suited. In this case, the possible emitted wavelengths are subject to a condition insofar as the effective Verdet's constant of the Faraday element should have in each case at least the above-mentioned value of 0.0014°/A at these wavelengths.

In addition, the transmitting device to generate the two elliptically polarized light signals also comprise a linear polarizer if the light emitted by the light source is unpolarized.

The Faraday element can be embodied as a fiber coil, e.g. made of a quartz glass fiber, as a solid glass ring e.g. made of flint glass, or as a magneto-optical bulk single crystal e.g. made of a BSO (bismuth silicone oxide), a BGO (bismuth germanium oxide) or a YIG (yttrium iron garnet). In this case, the magneto-optical bulk single crystal may also be situated in an air gap of a magnetic flux concentrator enclosing the electrical conductor.

In order to meet the abovementioned condition for the effective Verdet's constant, by way of example in the case of a fiber coil made of a quartz glass fiber, the number of turns has to be at least 10 if the two wavelengths used are of the order of magnitude of 800 nm. If wavelengths of the order of magnitude of 1300 nm are envisaged, then the number of turns correspondingly has to be at least 25. By contrast, a suitable glass ring in which the two light signals are passed once around the electrical conductor is composed of flint glass. By way of example, flint glass from Schott with the type designation SF6 or SF57 can be used here. Such a glass ring is intended for operation at wavelengths of the order of magnitude of 485 nm. Owing to the, in general, non-existent possibility for increasing the sensitivity (=effective Verdet's constant) over a repeated light circulation, such a glass ring, despite the higher material-specific sensitivity of flint glass compared with quartz glass, meets the condition for the lower limit of sensitivity (=0.0014°/A) at distinctly shorter wavelengths than is the case with a quartz glass fiber coil. Free design parameters are thus the geometry (=e.g. number of light circulations) of the Faraday element, the material-specific properties of the Faraday element and the wavelengths used.

The evaluation of the changes in the first and in the second polarization which are caused by the current to be measured is performed in an evaluation unit. The evaluation unit determines a value pair from the changes in polarization and then assigns a corresponding value of the electric current to the value pair using a stored look-up table. In this case, the evaluation unit may be realized using analog and/or digital circuitry. In particular, the evaluation unit may comprise a digital calculation unit, for example in the form of a digital signal processor.

An existing arrangement for optical current measurement can also be extended in a simple manner in the measurement range, since no intervention is necessary in the actual optical path. Rather, the extension of the measurement range is achieved solely by exchanging the exist transmitting, receiving and evaluating devices.

In a preferred embodiment, the transmitting device also comprises a unit for simultaneously feeding the two light signals into the Faraday element. In this case, a coupler may be involved which feeds the light signals originating from different light sources into a common optical waveguide leading to the Faraday element.

FIG. 1 illustrates an arrangement for optically measuring an electric current I flowing in a current conductor 5. Two light signals having a first wavelength $\lambda 1$ and a second wavelength $\lambda 2$, respectively, are generated in a first light source 11 and a second light source 12. The two light signals are fed to a polarizer 21 via a coupler 31, which is designed as a 2×1 fiber coupler in the present case. A first light signal L1 having a first linear polarization and the first wavelength $\lambda 1$ and also a second light signal L2 having a second linear polarization and the second wavelength $\lambda 2$ are then present at the output of the polarizer. Instead of the linear polarization, elliptical polarization with a preferred direction is also possible.

The two linearly polarized light signals L1 and L2 are then fed to a Faraday element 10, which is assigned to the current conductor 5. They are fed jointly in this case, for example via an optical waveguide (not specifically illustrated). In another exemplary embodiment (not illustrated), the linear polarization of the two light signals is not generated until directly before entry into the Faraday element 10.

In the Faraday element 10, the linear first and second polarizations of the first and, respectively, second light signals L1 and L2, respectively, are rotated about a first and, respectively, a second angle $\rho 1$ and $\rho 2$ of rotation. In this case, the angles $\rho 1$ and $\rho 2$ of rotation are each dependent on the magnitude of the electric current I and on a constant determined by the Faraday element 10, a so-called Verdet's constant V. The Verdet's constant V is dependent on a material used in the Faraday element 10, on an ambient temperature and on a light wavelength $\lambda$ radiated through the Faraday element 10. In particular, the dependence on the light wavelength $\lambda$ is of particular importance for the exemplary embodiment—illustrated in FIG. 1—of a magneto-optical current transducer with an extended measurement range. The following empirically determined relationship can be specified for the wavelength dependence of the Verdet's constant V:

$$V(\lambda) = \frac{180}{\lambda} \cdot \frac{n^2(\lambda)-1}{n(\lambda)} \left( A + \frac{B}{\lambda^2 - \lambda_c^2} \right) \quad (1)$$

where $n(\lambda)$ designates a wavelength-dependent refractive index of the material used and A, B and $\lambda_c$ designate material constants which can be taken for example from a relevant table work.

For a Faraday element 10 designed as a fiber coil with N turns, the first angle $\rho 1$ of rotation for the first light signal L1 then turns out to be:

$$\rho 1 = N \cdot V(\lambda 1) \cdot I. \quad (2)$$

For the second light signal having the second light wavelength $\lambda 2$, a second angle $\rho 2$ of rotation correspondingly turns out as:

$$\rho 2 = N \cdot V(\lambda 2) \cdot I.$$

From the wavelength-dependent Verdet's constant V and the number N of turns it is possible to form an effective Verdet's constant Veff, so that the first and the second angle of rotation, ρ1 and ρ2 respectively, depend exclusively on this wavelength-dependent effective Verdet's constant Veff and the electric current I to be measured. In a corresponding manner, an effective Verdet's constant Veff can also be defined for other embodiments of the Faraday element 10, for example a glass ring or a magneto-optical bulk crystal, which constant then includes the respective geometry-dependent influencing variables.

The specialist literature also includes a definition—which is different from equations (2) and (3)—of Verdet's constant V as a material-specific wavelength-dependent proportionality constant which specifies the relationship between the angle of rotation and the product of magnetic induction and light path length. However, both definitions of Verdet's constant V can be converted into one another in a simple manner.

After passing trough the Faraday element 10, the two light signals L1 and L2, whose polarization has been rotated, are evaluated in an evaluation unit 20. In an analyzer 22, which is designed as Wollaston Prisma in the present case, the two light signals L1 and L2 are first of all split into two light signal elements LT1 and LT2 having mutually perpendicular planes of polarization. This corresponds to the evaluation which is designated as "two-channel" above. If, in another exemplary embodiment (not illustrated), the analyzer 22 allows the two light signals L1 and L2 whose polarization has been rotated to pass with regard to one plane of polarization, then, by contrast, single-channel evaluation is present.

The two light signal elements LT1 and LT2 are split into wavelength-selective components by couplers 32 and 33 and optical transmission filters 34, 35, 36 and 37 tuned to the first and second wavelengths. Optoelectrical transducer units 41, 42, 43 and 44 convert the components into electrical signals I11, I12, I21 and I22 which each comprise an item of information about the first and, respectively, the second angle ρ1 and ρ2 of rotation caused by the current I to be measured at the respective wavelength λ1 and λ2. The optical transmission filters 34, 35, 36 and 37 are embodied as interference filters. However, they may likewise be realized as cut-off filters. The optoelectrical transducer units 41, 42, 43 and 44 each comprise a photodiode tuned to the corresponding wavelength λ1 or λ2, and a transimpedance amplifier connected downstream.

In a signal processing unit 101, a measurement signal M for the electric current I is derived from the electrical signals I11, I12, I21 and I22. In order to eliminate interference-quantity influences, intensity normalization is firstly provided in the signal processing unit 101 prior to the actual evaluation. However, this intensity normalization is not absolutely necessary, it can also be omitted. The subsequent actual determination of the measurement signal M is effected according to a method disclosed in the prior art. In order to carry out this determination, the signal processing unit 101 also contains a digital calculation unit in the form of a digital signal processor.

Disregarding the interference-quantity influences, which are not of interest in this connection, the electrical signals I11, I12, I21 and I22 have an essentially sinusoidal dependence on twice the first or second angle of rotation, ρ1 or ρ2 respectively. An unambiguity range determined by the sine function is thus obtained for the electric current I to be measured. The measurement range is initially limited to this unambiguity range. However, the arrangement illustrated in FIG. 1 serves precisely to extend the measurement range beyond said unambiguity range in a particularly simple and efficient manner.

For this purpose, the Faraday element 10 is dimensioned precisely such that the following holds true for its effective Verdet's constant Veff at both light wavelengths λ1 and λ2:

$$\text{Veff} \geq 0.0014°/A. \tag{4}$$

The dependence of Verdet's constant V on the wavelength λ as specified in equation (1) is based, in principle, on a proportionality relationship in accordance with:

$$V(\lambda) \propto \frac{1}{\lambda^2} \tag{5}$$

This becomes apparent if the wavelength dependence of the refractive index n(λ) is also taken into consideration in equation (1). For a Faraday element 10 designed as a fiber coil or glass ring, the following relationship can be derived using equation (5) for the effective Verdet's constant Veff:

$$\text{Veff}(\lambda) = V_0 \cdot N \cdot \left(\frac{\lambda_0}{\lambda}\right)^2 \tag{6}$$

where $V_0$ designates a known value of Verdet's constant V at a given wavelength ($\lambda_0$). The value pair ($V_0$, $\lambda_0$) is material-specific in this case. N generally denotes the number of closed circulations of the two light signals L1 or L2 around the electrical conductor 5. In the case of a fiber coil, N then corresponds to the number of turns, as already specified in connection with equations (2) and (3). In a glass ring, by contrast, the light is generally passed once around the conductor 5, through which current flows, with the result that N assumes the value one in this case.

For quartz glass and flint glass as light-guiding media, a Verdet's constant $V_0$ of about 0.00015°/A and of about 0.00075°/A, respectively, are known, for example, at a wavelength $\lambda_0$ of 820 nm. If these material parameters are inserted into equation (6) and if account is also taken of the requirement for minimum sensitivity in accordance with equation (4), then a dimensioning specification is obtained for the Faraday element 10. Free parameters here are the number of light circulations and the wavelength λ.

Consequently, for a fiber coil which is made of a quartz glass fiber and is operated at 820 nm, the resulting number of turns is at least 10. In a corresponding manner, for a fiber coil which is made of a flint glass fiber and is operated at the same wavelength, the resulting number of turns is at least 2. By contrast, for a flint glass ring (N=1), a highest possible operating wavelength of 600 nm is obtained as a specification.

The Faraday element 10 shown in FIG. 1 is embodied as a fiber coil made of a quartz glass fiber having a number of turns N≥10. The two light wavelengths λ1 and λ2 are 780 nm and 840 nm, respectively. The first and second light sources 11 and 12, respectively, are laser diodes which emit narrow band CW light signals at the wavelengths specified.

Specifically, for extending the measurement range relative to the unambiguity range by at least one order of magnitude, it is advantageous if the difference between the first and the second light wavelength λ1 and λ2, respectively, is as small as possible. In order to obtain a measurement range that is as large as possible, the first and the second wavelength λ1 and λ2, respectively, are therefore chosen in such a way that their wavelength difference is at most 15% of the arithmetic mean of both wavelengths λ1 and λ2.

In an exemplary embodiment (not illustrated) in which the two wavelengths λ1 and λ2 are of the order of magnitude of 1300 nm, the fiber coil used as Faraday element 10 then has at least 25 turns in order to meet the abovementioned condition for the effective Verdet's constant Veff.

Figure 2:
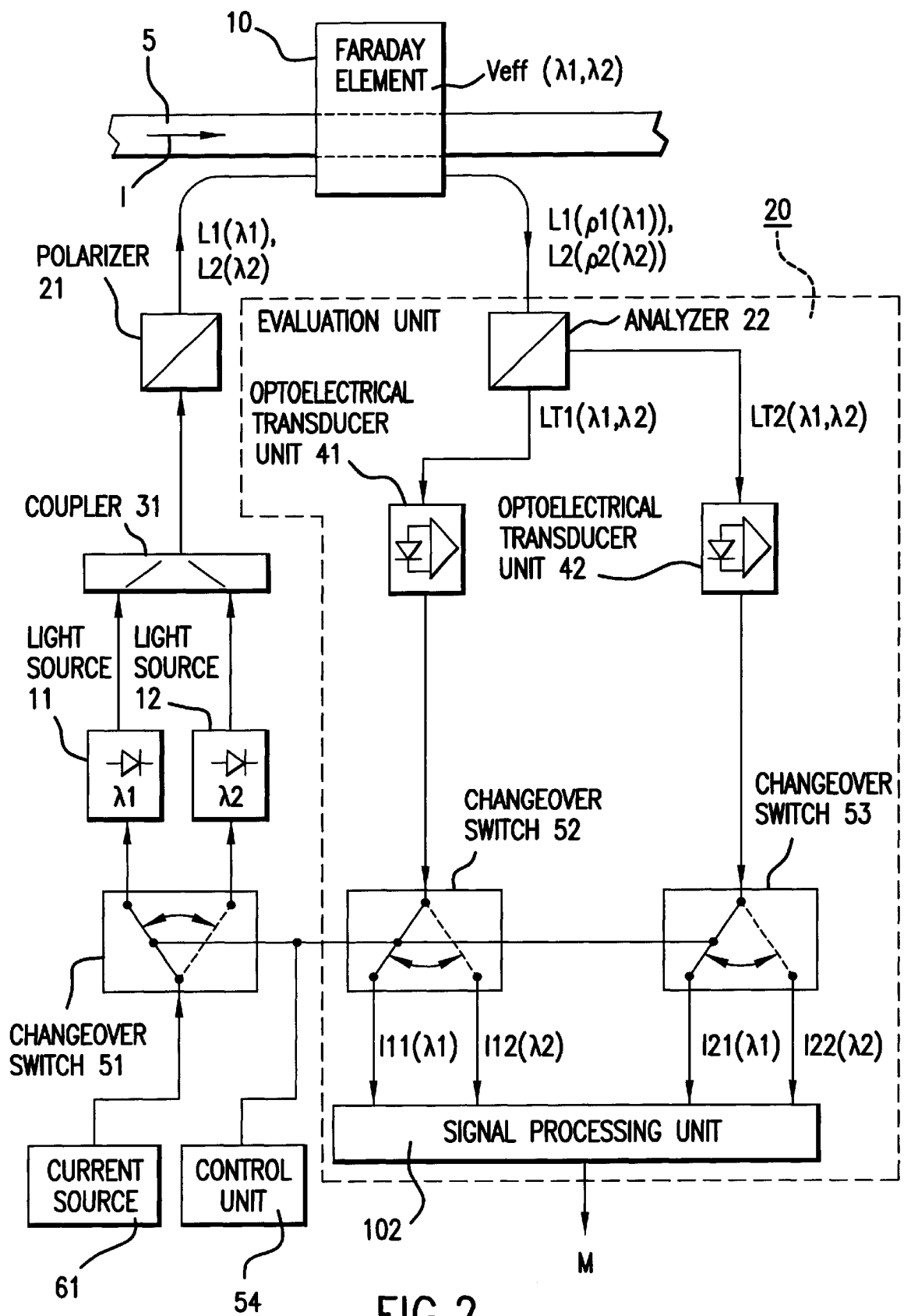
FIG. 2 shows an arrangement for optical current measurement with two light signals having different wavelengths which are fed alternately into a Faraday element.

In the case of the arrangement for detecting an electric current I as illustrated in FIG. 2, the two light signals L1 and L2 are fed into the Faraday element 10 not simultaneously but cyclically alternately. To that end, the light sources 11 and 12 are connected via a transmission changeover switch 51 to a current source 61, which supplies the light sources 11 and 12 and excites them to effect light emission. The transmission changeover switch 51 is controlled by a control unit 54 in such a way that one of the two light sources 11 or 12 is supplied with current and thus emits light. The transmission changeover switch 51 and the control unit 54 thus enable the two light signals L1 and L2 to be fed into the Faraday element 10 cyclically alternately. Moreover, if the method of operation of the arrangement shown in FIG. 1 is referred to as wavelength domain multiplex, then the method of operation of the arrangement of FIG. 2 correspondingly represents time domain multiplex operation.

Since the two light signals L1 and L2 having different wavelengths $\lambda 1$ and $\lambda 2$ do not pass through the Faraday element 10 simultaneously, there is also no need for optical means for wavelength separation in the evaluation unit 20. The electrical signals I11, I12, I21 and I22, which carry the measurement information about the electric current I as a function of one of the two wavelengths $\lambda 1$ and $\lambda 2$, are obtained by reception changeover switches 52 and 53, respectively, being connected between the optoelectrical transducer units 41 and 42 and a signal processing unit 102. The reception changeover switches 52 and 53 are changed over by the control unit 54 with the same timing as the transmission changeover switch 51.

Synchronization of the transmission changeover switch 51 and of the reception changeover switches 52 and 53 is possible without difficulty since the evaluation unit 20 and also the transmitting device to generate the two light signals L1 and L2 are usually situated in close local proximity, in particular even in one and the same assembly housing.

The further processing of the electrical signals I11, I12, I21 and I22 is effected analogously to the exemplary embodiment of FIG. 1. Likewise, the parameters for the light wavelengths $\lambda 1$ and $\lambda 2$ used and also for the effective Verdet's constant Veff are chosen analogously to the exemplary embodiment of FIG. 1.

Figure 3:
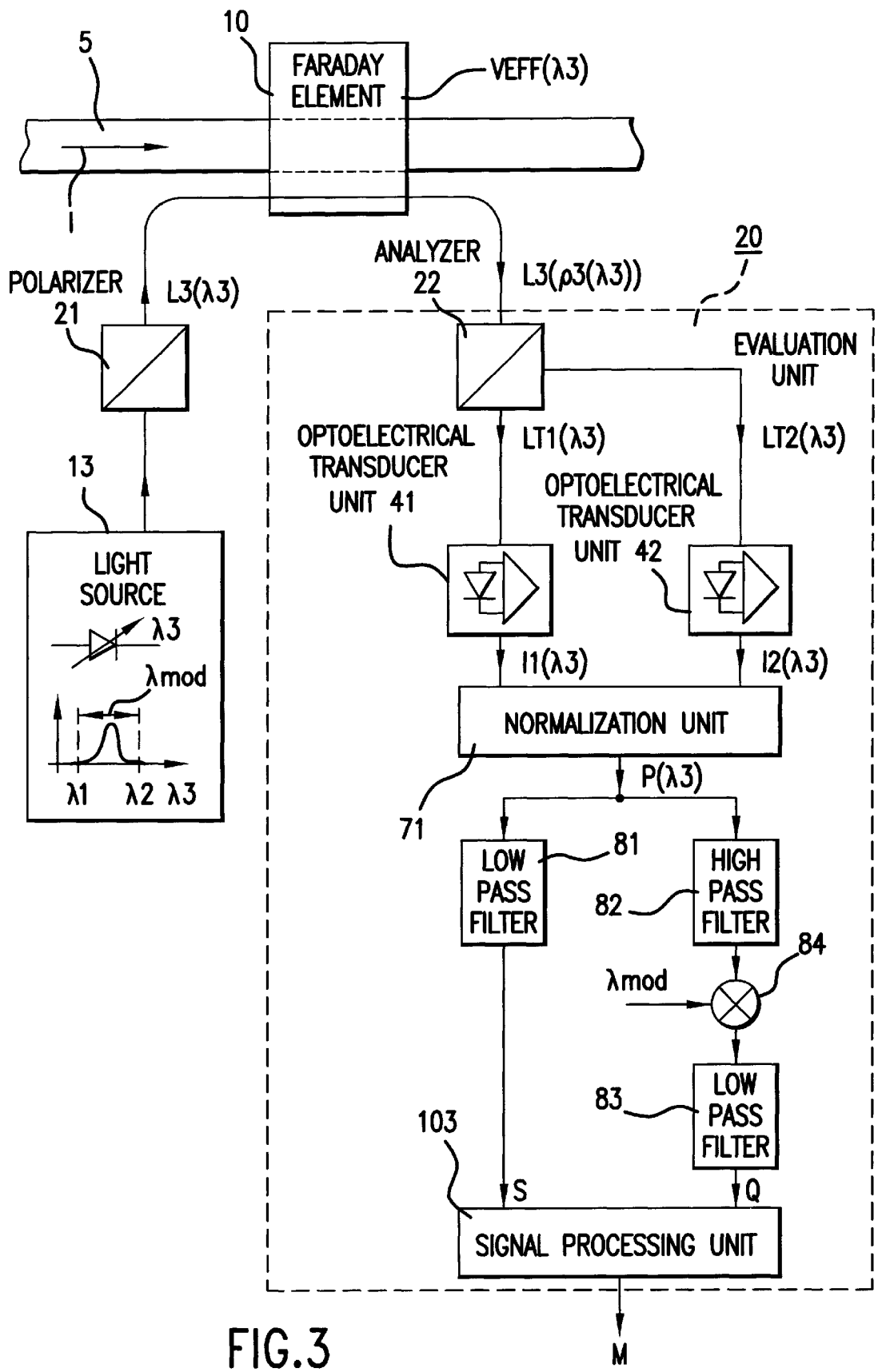
FIG. 3 shows an arrangement for current measurement with a light signal having a varying wavelength which is fed into a Faraday element.

The arrangement of the exemplary embodiment of FIG. 3 uses, instead of two light signals L1 and L2 each having a different first and second wavelength $\lambda 1$ and $\lambda 2$, respectively, an optical swept-frequency signal L3 having a varying light wavelength $\lambda 3$. In this case, the varying light wavelength $\lambda 3$ periodically assumes values between the first and the second wavelength $\lambda 1$ and $\lambda 2$, respectively. The transmitting device used to generate the optical swept-frequency signal L3 is a light source 13 which can be tuned in the emitted wavelength and is modulated with a corresponding wavelength modulation signal $\lambda$mod.

The light source 13 is designed as a TFL, whose emitted narrowband wavelength can be varied about a central wavelength of e.g. 810 nm. In this case, the first and second wavelengths $\lambda 1$ and $\lambda 2$, respectively, are again chosen in such a way that the wavelength difference is at most 15% of the central wavelength. In the exemplary embodiment of FIG. 3, the first wavelength $\lambda 1$ has a value of 800 nm and the second wavelength $\lambda 2$ has a value of 820 nm. Alternative transmitting device to generate the optical swept-frequency signal L3 are a broadband-emitting light source such as e.g. a superluminescent diode (SLD) and a modulable narrowband transmission filter connected downstream. In this case, the transmission filter can be arranged both on the transmitter and on the receiver.

In the Faraday element 10, the polarization of the optical swept-frequency signal L3 is rotated by a third angle ρ3 of rotation as a function of the electric current I and of the varying light wavelength $\lambda 3$. Owing to the varying light wavelength $\lambda 3$, this angle ρ3 of rotation is based also on a varying characteristic curve instead of a constant one. In the evaluation unit 20, firstly the optoelectrical transducer units 41 and 42 convert the two light signal elements LT1 and LT2, respectively, into electrical signals I1 and I2, respectively, from which a normalized signal P is generated in a normalization unit 71. The normalized signal P carries the measurement information about the electric current I still as a function of the varying wavelength $\lambda 3$. Filtering of the normalized signal P in a first low-pass filter 81 yields an average-value signal S, which corresponds to an average characteristic curve of the characteristic-curve variation.

In addition, a variation component corresponding to the swing of the characteristic-curve variation is extracted from the normalized signal P in a high-pass filter 82. This swing of the characteristic-curve variation about the average characteristic curve is determined by the wavelength modulation signal $\lambda$mod. In a multiplier 84, therefore, the variation component is superposed with the wavelength modulation signal $\lambda$mod and subsequently filtered in a second low-pass filter 83. A quadrant signal Q is determined by this procedure known from quadrature demodulation. Just like the average-value signal S, said quadrant signal carries an item of (ambiguous) measurement information about the electric current I.

From the average-value signal S and the quadrant signal Q, a signal processing unit 103 determines the measurement signal M for the electric current I. This is done using a look-up table stored in the signal processing unit 103.

The periodic variation—determined by the wavelength modulation signal $\lambda$mod—of the wavelength $\lambda 3$ between the first and second wavelengths is sinusoidal. However, its profile may also be a sawtooth waveform or another periodic signal waveform. In this case, a modulation frequency Fmod of the wavelength modulation signal $\lambda$mod has a frequency value which is at least twice as large as that of a maximum harmonic of a highest frequency component—to be detected—of the electric current I. Specifically, as soon as the sinusoidal characteristic curve of the Faraday element 10 is modulated beyond the linear range, harmonic components (=bessel components) arise whose frequency is higher, the higher the modulation is. The above frequency condition applies analogously to a change over frequency of the arrangement shown in FIG. 2. In the example of FIG. 3, the modulation frequency Fmod has a value of 200 kHz, for example.

Figure 4:
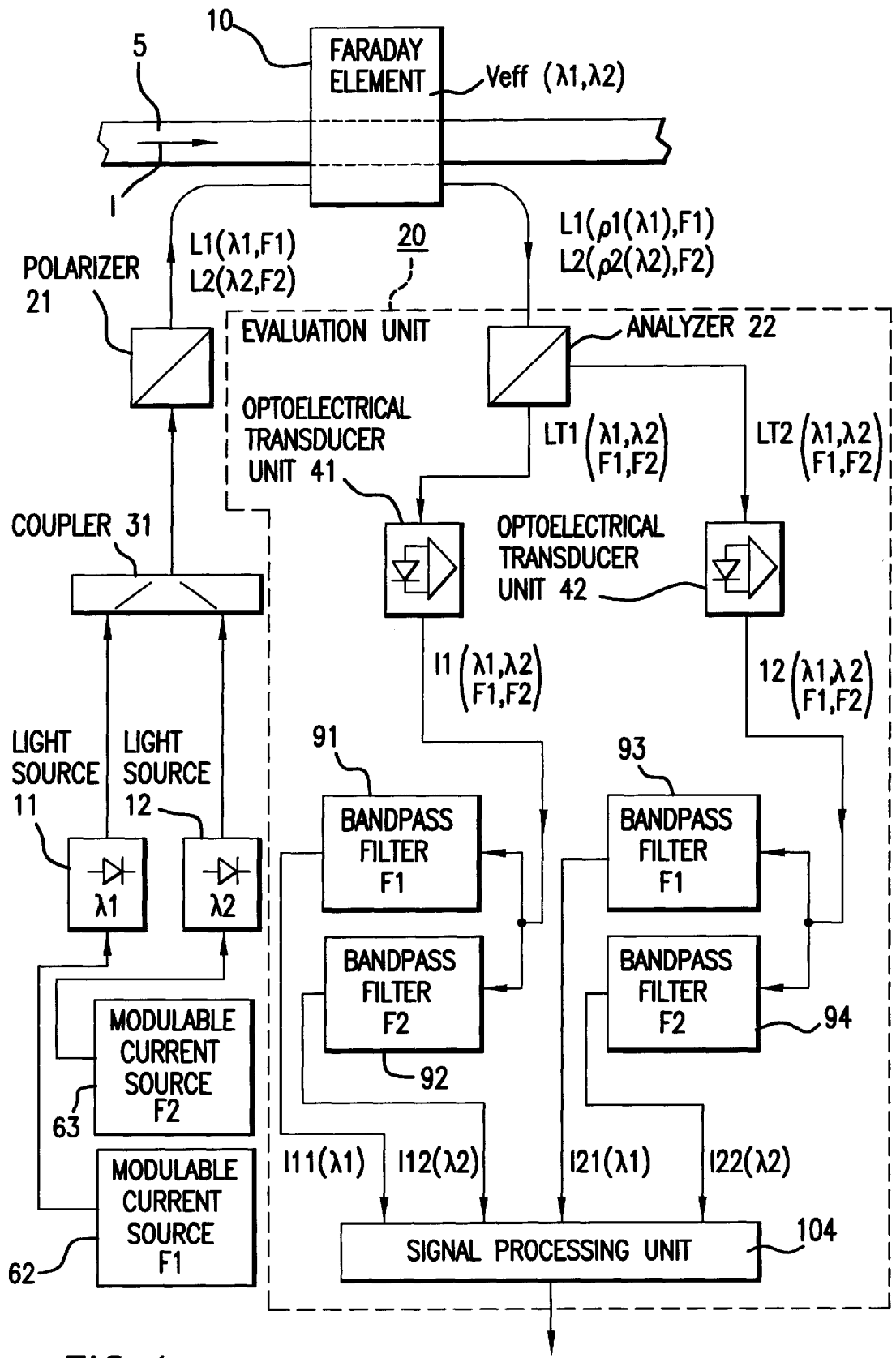
FIG. 4 shows an arrangement for optical current measurement with two intensity-modulated light signals having different wavelengths which are fed simultaneously into a Faraday element.

FIG. 4 illustrates an arrangement for optically detecting the electric current I in which the light sources 11 and 12 are supplied via modulable current sources 62 and 63. The modulable current sources 62 and 63 make available to the light sources 11 and 12, respectively, a current signal whose amplitude is modulated in a square-wave, sinusoidal or sawtooth manner with a first frequency F1 and, respectively, with a second frequency F2. These modulated current signals cause the first and second light sources 11 and 12, respectively, to emit optical signals whose intensity is modulated with the first and, respectively, the second frequency F1 and F2, respectively. The modulable current sources 62 and 63 act as a modulation device for intensity modulation of the two light signals L1 and L2.

A frequency difference between the two frequencies F1 and F2 advantageously lies between 1 kHz and 1 MHz. This reliably avoids crosstalk. In the present case, a value of 200 kHz is envisaged for the first frequency F1 and a value of 300 kHz is envisaged for the second frequency F2. In another exemplary embodiment, the first and second frequencies F1 and F2, respectively, have a value of 50 and 60 kHz, respectively. In this case, the two frequencies F1 and F2 are again chosen in such a way that their respective frequency value is at least twice as large as that of the maximum harmonic of the highest frequency component—to be detected—of the electric current I.

The first and second light signals L1 and L2 fed into the Faraday element 10 thus differ not only in their wavelength but also in the frequency of their intensity modulation. The two light signals L1 and L2 are fed in simultaneously, analogously to the exemplary embodiment of FIG. 1. Thus, wavelength domain multiplex operation is again present, although in this case with additional intensity modulation.

In the evaluation unit 20, the electrical signals I11, I12, I21 and I22 including the wavelength-related measurement information about the electric current I are generated by electrical bandpass filtering. To that end, the electrical signals 11 and 12 generated from the two light signal elements LT1 and LT2 by the optoelectrical transducer units 41 and 42 are fed to first bandpass filters 91 and 93, respectively, with a center frequency corresponding to the first frequency F1, and to second bandpass filters 92 and 94, respectively, with a center frequency corresponding to the second frequency F2. Further processing of the electrical signals I11, I12, I21 and I22 then follows in a signal processing unit 104, said further processing essentially corresponding to that described in connection with the exemplary embodiments of FIGS. 1 and 2. Likewise, the first and second wavelengths λ1 and λ2, respectively, used in the exemplary embodiment of FIG. 4 and also the Faraday element 10 are dimensioned analogously to the exemplary embodiments of the preceding figures.

In addition to the transmissive embodiment—described in FIGS. 1 to 4—with light being fed in on one side in each case, reflective embodiments of the arrangement or embodiments with light being fed into the Faraday element 10 in opposite directions are also possible.

While the invention has been explained with respect to the embodiments described above, it will be apparent to those skilled in the art that various modifications and improvements may be made without departing from the spirit and scope of the invention. Accordingly, it is to be understood that the invention is not to be limited by the specific illustrated embodiments, but only by the scope of the appended claims.

What is claimed is:

1. A method for optically detecting an electric current, comprising:
    generating at least one first elliptically polarized light signal having a first polarization and a first wavelength and a second elliptically polarized light signal having a second polarization and a second wavelength, which is different from the first wavelength, are generated;
    feeding the first and the second light signal into a Faraday element;
    changing the first and the second polarization as a function of the electric current upon passage through the Faraday element; and
    deriving a measurement signal for the electric current from the changes in polarization of the two light signals, wherein
        the first and the second polarization are rotated by at least 0.0014° per ampere of the electric current, and
        at least one of the two polarizations is rotated by more than 45° under the influence of a maximum electric current.

2. The method as claimed in claim 1, wherein the first and the second polarization are rotated in the Faraday element by a first and a second angle of rotation, respectively, the first and the second angle of rotation differing at most by a factor 2 given a predetermined electric current.

3. The method as claimed in claim 1 wherein there is a wavelength difference between the first and the second wavelength of at most 15% of an average value of the first and second wavelengths.

4. The method as claimed in claim 1, wherein the first and the second light signals pass through the Faraday element simultaneously.

5. The method as claimed in one of claims 1 wherein the first and the second light signals pass through the Faraday element cyclically alternately.

6. The method as claimed in claim 5, wherein the first and the second light signal are generated from an optical swept-frequency signal having a varying wavelength, the varying wavelength being tuned between the first wavelength and the second wavelength.

7. The method as claimed in claim 6, wherein the varying wavelength of the optical swept-frequency signal is tuned periodically between the first wavelength and the second wavelength.

8. The method as claimed in claim 1, wherein the first and the second light signal are intensity-modulated during generation with a first and a second frequency, respectively.

9. A system to optically detect an electric current in an electrical conductor, comprising:
    a transmitting device to generate at least one first elliptically polarized light signal having a first polarization and a first wavelength and a second elliptically polarized light signal having a second polarization and a second wavelength, which is different from the first wavelength;
    a Faraday element, which is assigned to the electrical conductor and through which the first and the second light signal pass, the Faraday element effecting a change in the first and second polarization as a function of the electric current to be detected and of a wavelength-dependent effective Verdet's constant; and
    an evaluation unit to derive a measurement signal for the electric current from the changes in the first and second polarization, wherein
        the effective Verdet's constant of the Faraday element has a value of at least 0.0014°/A for both wavelengths, and
        the Faraday element rotates at least one of the two polarizations by more than 45° given the electric current.

10. The system as claimed in claim 9, wherein values of the effective Verdet's constant for the first and the second wavelength differ at most by the factor 2.

11. The system as claimed in claim 9 wherein the transmitting device is configured to generate the first and the second light signal with a wavelength difference of at most 15% of an average value of the first and second wavelength.

12. The system as claimed in claim 9, wherein the transmitting device is configured to simultaneously feed the first and the second light signal into the Faraday element.

13. The system as claimed in claim 9, wherein the transmitting device is configured to cyclically alternately feed the first and the second light signal into the Faraday element.

14. The system as claimed in claim 13, wherein the transmitting device is configured to cyclically alternately feed the first and the second light signal and comprise a tunable light source to generate an optical swept-frequency signal having a varying wavelength, the varying wavelength varying between the first and the second wavelength.

15. The system as claimed in claim 14, wherein the tunable light source is configured to generate an optical swept-frequency signal having a periodically varying wavelength.

16. The system as claimed in claim 9, wherein the transmitting device comprises a modulation-device to intensity modulate the first light signal with a first frequency and the second light signal with a second frequency.

* * * * *